US007196595B2

(12) United States Patent
Tsai et al.

(10) Patent No.: US 7,196,595 B2
(45) Date of Patent: Mar. 27, 2007

(54) MULTILAYER DIPLEXER

(75) Inventors: Chieh Yu Tsai, Tainan (TW); Tsung Ta Tsai, Tainan (TW)

(73) Assignee: Darfon Electronics Corp., Kweishan Taoyuan (TW)

( * ) Notice: Subject to any disclaimer, the term of this patent is extended or adjusted under 35 U.S.C. 154(b) by 59 days.

(21) Appl. No.: 11/024,352

(22) Filed: Dec. 28, 2004

(65) Prior Publication Data

US 2005/0146398 A1 Jul. 7, 2005

(30) Foreign Application Priority Data

Jan. 7, 2004 (TW) .............................. 93100322 A

(51) Int. Cl.
*H03H 7/46* (2006.01)
*H01P 5/12* (2006.01)
*H04L 5/00* (2006.01)

(52) U.S. Cl. ...................... 333/134; 333/100; 333/132; 333/185; 370/297; 455/78; 455/82

(58) Field of Classification Search ................ 333/100, 333/132, 134, 185; 455/78, 82; 370/297
See application file for complete search history.

(56) References Cited

U.S. PATENT DOCUMENTS 4,499,495 A * 2/1985 Strammello ................. 348/731
6,411,178 B1 * 6/2002 Matsumura et al. ......... 333/134
6,621,400 B2 * 9/2003 Horie ......................... 336/200
6,937,845 B2 * 8/2005 Watanabe et al. ............. 455/83
6,975,841 B2 * 12/2005 Uriu et al. ..................... 455/78
2006/0006960 A1 * 1/2006 Lin et al. .................... 333/132

FOREIGN PATENT DOCUMENTS

JP 2001267872 A * 9/2001

* cited by examiner

*Primary Examiner*—Robert Pascal
*Assistant Examiner*—Kimberly E Glenn
(74) *Attorney, Agent, or Firm*—Thomas, Kayden, Horstemeyer & Risley

(57) ABSTRACT

A multilayer diplexer has a first I/O terminal, a second I/O terminal, an antenna terminal, a high-pass filter coupled between the antenna terminal and the second I/O terminal, and a low-pass filter coupled between the antenna terminal and the first I/O terminal. The high-pass filter has a first capacitor and a second capacitor connected in serial coupled between the antenna terminal and the second I/O terminal, a fourth capacitor coupled between the antenna terminal and the second I/O terminal, and a first inductor coupled between a connection node of the first and second capacitors and a reference ground. The low-pass filter has a second inductor coupled between the antenna terminal and the first I/O terminal, and a third and fifth capacitor connected in parallel coupled between the antenna terminal and the first I/O terminal.

11 Claims, 4 Drawing Sheets

MULTILAYER DIPLEXER

BACKGROUND

The invention relates in general to a diplexer. In particular, the invention relates to a diplexer fabricated using multilayer low temperature co-fired ceramic (LTCC).

With progress in communication technology, communication products are requested to be light, thin, short and small. High frequency filter circuits or switches in the front end of communication products are fabricated as ceramic devices using multilayer LCTT due to its good electrical performance on high frequency application. To further improve integration and scaling-down of ceramic devices, two main directions are focused. One is to improve the fabricating material such as increasing dielectric value and reducing dielectric thickness of capacitors. The other is to improve circuit configuration and layout.

Diplexers play an important role in dual band communication system, having a three-port circuit network for separating different frequency signals. Diplexers usually output high frequency signals and low frequency signals to different ports. In addition, diplexers also combine different frequency signals together. FIG. 1 schematically shows function blocks of a conventional diplexer. In FIG. 1, the diplexer comprises a low-pass filter 1 and a high-pass filter 3 and directs (or filters) input signal from antenna terminal $A_1$, to port $I/O_{(1)}$ or $I/O_{(2)}$ according to frequency band of the input signal. When the input signal has higher frequency, the low-pass filter 1 is preferred to work almost as an open circuit, and therefore only the high-pass filter 3 dominates function of the diplexer to ensure no high frequency signal output to port $I/O_{(1)}$. Similarly, when the input signal has lower frequency, the high-pass filter 3 is preferred to work almost as an open circuit, and therefore only the low-pass filter 1 dominates function of the diplexer to ensure no low frequency signal output to port $I/O_{(2)}$.

FIG. 2 is a circuit diagram of a conventional diplexer. In FIG. 2, the diplexer comprises a low-pass filter 21 having an inductor $L_3$, capacitors $C_6$ and $C_8$; and a high-pass filter 23 having inductors $L_4$ and $L_5$, and capacitors $C_7$ and $C_9$. The inductor $L_3$ and capacitors $C_6$ and $C_8$ constitute a LC resonant circuit isolating signals of high frequency band and passing signals of low frequency band. The inductors $L_4$ and $L_5$ and capacitor $C_7$ constitute a LC resonant circuit isolating signals of low frequency band and passing signals of high frequency band.

FIG. 3 is a circuit diagram of another conventional diplexer. In FIG. 3, the diplexer comprises a low-pass filter 31 having an inductor $L_6$, capacitors $C_{10}$ and $C_{12}$; and a high-pass filter 33 having an inductor $L_7$, and capacitors $C_{11}$, $C_{13}$ and $C_{14}$. The inductor $L_6$ and capacitor $C_{10}$ constitute a LC resonant circuit isolating signals of high frequency band and passing signals of low frequency band. The inductor $L_7$ and capacitor $C_{11}$ constitute a LC resonant circuit isolating signals of low frequency band and passing signals of high frequency band.

FIG. 4 shows frequency response of the conventional diplexer depicted in FIG. 2 (or FIG. 3); wherein curves (a) and (b) respectively represent the frequency responses of high-pass filter and low-pass filter. In FIG. 4, first cut-off frequency (or resonant frequency) fp1 is determined in accordance with the inductor $L_3$ and capacitor $C_6$ in FIG. 2 (or the inductor $L_6$ and capacitor $C_{10}$ in FIG. 3). Second cut-off frequency fp2 is determined in accordance with the inductor $L_4$ and capacitor $C_7$ in FIG. 2 (or the inductor $L_7$ and capacitor $C_{11}$ in FIG. 3). The resonant frequency fp of LC resonant circuit is determined as $$fp = \frac{1}{2\pi\sqrt{LC}}.$$

Therefore, the lower the required resonant frequency (or cut-off frequency), the larger the required inductance L and capacitance C; this limits wire routing and circuit configuration on designing the diplexer.

Multilayer LTCC can be used to fabricate multilayer diplexer such that smaller inductance C and capacitance C are easily designed to obtain required resonant frequency in low frequency band and therefore reduces bulk of the diplexer.

SUMMARY

The invention is directed to a multilayer diplexer with a high-pass filter having new circuit configuration which uses Δ-Y transforming theory and therefore can be implemented using devices with smaller inductances and capacitances while achieving required functions.

The invention is directed to a circuit and layer configuration for a multilayer diplexer fabricated using multilayer LTCC (low temperature co-fire ceramic).

According to one exemplary embodiment of the invention, the diplexer comprises a first I/O terminal transmitting signals of low frequency band, a second I/O terminal transmitting signals of high frequency band, an antenna terminal, a high-pass filter for filtering out signals of low frequency band and passing signals of high frequency band, and a low-pass filter filtering out signals of high frequency band and passing signals of low frequency band.

The high-pass filter comprises a first capacitor coupled to the antenna terminal, a second capacitor coupled between the first capacitor and the second I/O terminal, a fourth capacitor coupled between the antenna terminal and the second I/O terminal, and a first inductor coupled between the connection node of the first and second capacitors and a reference ground. The low-pass filter comprises a second inductor coupled between the antenna terminal and the first I/O terminal, a third capacitor coupled between the antenna terminal and the first I/O terminal, and a fifth capacitor coupled between the first I/O terminal and the reference ground.

The high-pass filter according to the invention uses Δ-Y transforming theory and therefore can be implemented using devices with smaller inductances and capacitances while achieving required functions.

In addition, the circuit configuration according to the exemplary embodiment is fabricated by multilayer LTCC. The low-pass and high-pass filters are manufactured in multilayer structure, and thus the bulk of the diplexer can be further reduced for more economical design and fabrication.

DESCRIPTION OF THE DRAWINGS

The invention will be more fully understood from the detailed description, given hereinbelow, and the accompanying drawings. The drawings and description are provided for purposes of illustration only and, thus, are not intended to limit the invention.

DETAILED DESCRIPTION

Figure 5:
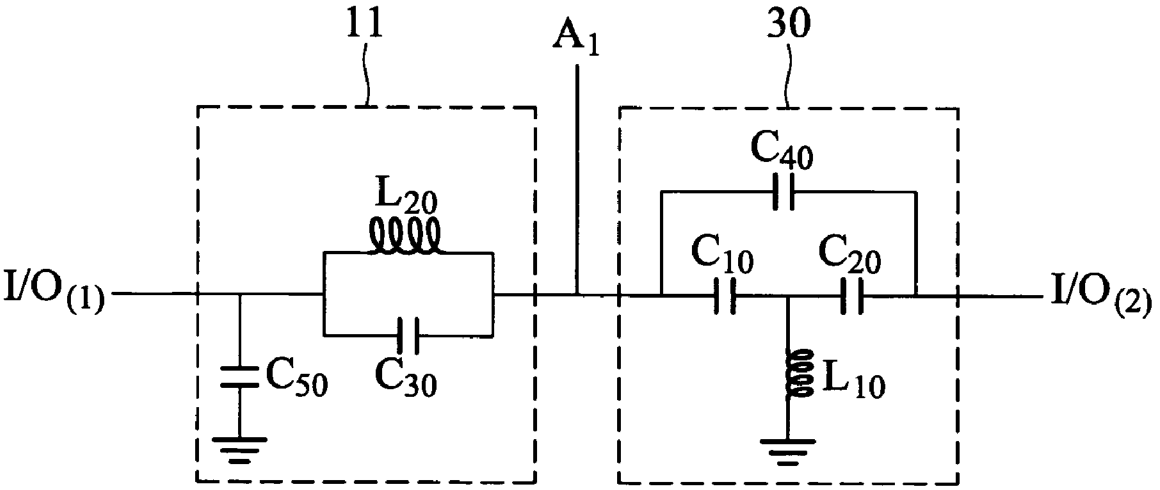
FIG. 5 shows circuit configuration of a multilayer diplexer according to a first embodiment of the invention.

FIG. 5 shows circuit configuration of a multilayer diplexer according to a first embodiment of the invention. In FIG. 5, the multilayer diplexer comprises a first I/O (input and output) terminal $I/O_{(1)}$, a second I/O terminal $I/O_{(2)}$, an antenna terminal $A_1$ coupling signals from an antenna (not shown in FIG. 5), a low-pass filter 11 coupled between the antenna terminal $A_1$ and the first I/O terminal $I/O_{(1)}$, and a high-pass filter 30 coupled between the antenna terminal $A_1$ and the second I/O terminal $I/O_{(2)}$.

Figure 4:
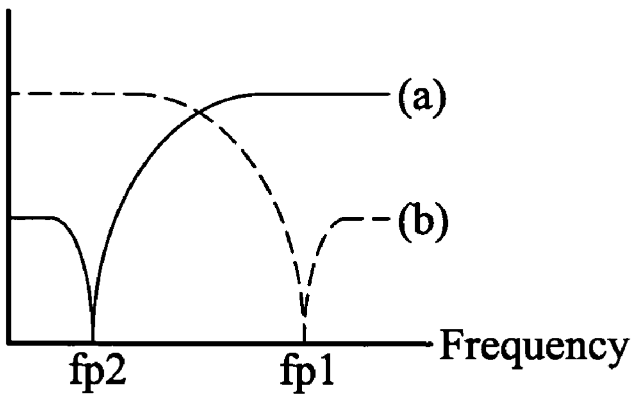
FIG. 4 (RELATED ART)
FIG. 4 shows frequency response of the conventional diplexer depicted in FIG. 2 (or FIG. 3).

In this embodiment, the high-pass filter 30 comprises a first capacitor $C_{10}$ connected to the antenna terminal $A_1$, a second capacitor $C_{20}$ connected between the first capacitor $C_{10}$ and the second I/O terminal $I/O_{(2)}$, a fourth capacitor $C_{40}$ connected between the antenna terminal $A_1$ and the second I/O terminal $I/O_{(2)}$, and a first inductor $L_{10}$ connected between the connection node of the first and second capacitors ($C_{10}$, $C_{20}$) and a reference ground. The circuit configuration of the high-pass filter 3 utilizes Δ-Y transform theory to reduce required capacitances (respective C of $C_{10}$, $C_{20}$ and $C_{40}$) and inductance (L of $L_{10}$), thereby obtaining an attenuation pole in low frequency band (cut-off frequency or resonant frequency of the high-pass filter, corresponding to fp2 in FIG. 4) and required function.

The low-pass filter 11 comprises a second inductor $L_{20}$ connected between the antenna terminal $A_1$ and the first I/O terminal $I/O_{(1)}$, a third capacitor $C_{30}$ connected between the antenna terminal $A_1$ and the first I/O terminal $I/O_{(1)}$, and a fifth capacitor $C_{50}$ connected between the first I/O terminal $I/O_{(1)}$ and the reference ground.

After a first signal is input to the diplexer via the antenna terminal $A_1$, the high-pass filter 30 filters out (or isolates) low frequency component of the first signal and passes high frequency component of the first signal to the second I/O terminal $I/O_{(2)}$, and the low-pass filter 11 filters out (or isolates) high frequency component of the first signal and passes low frequency component of the first signal to the first I/O terminal $I/O_{(1)}$. Similarly, when a second signal is output from the antenna terminal $A_1$ via the high-pass filter 30 or the low-pass filter 11, the high-pass filter 30 prevents low frequency component of the filtered second signal from being output to the second I/O terminal $I/O_{(2)}$, and the low-pass filter 11 prevents high frequency component of the filtered second signal from being output to the first I/O terminal $I/O_{(1)}$.

Figure 6:
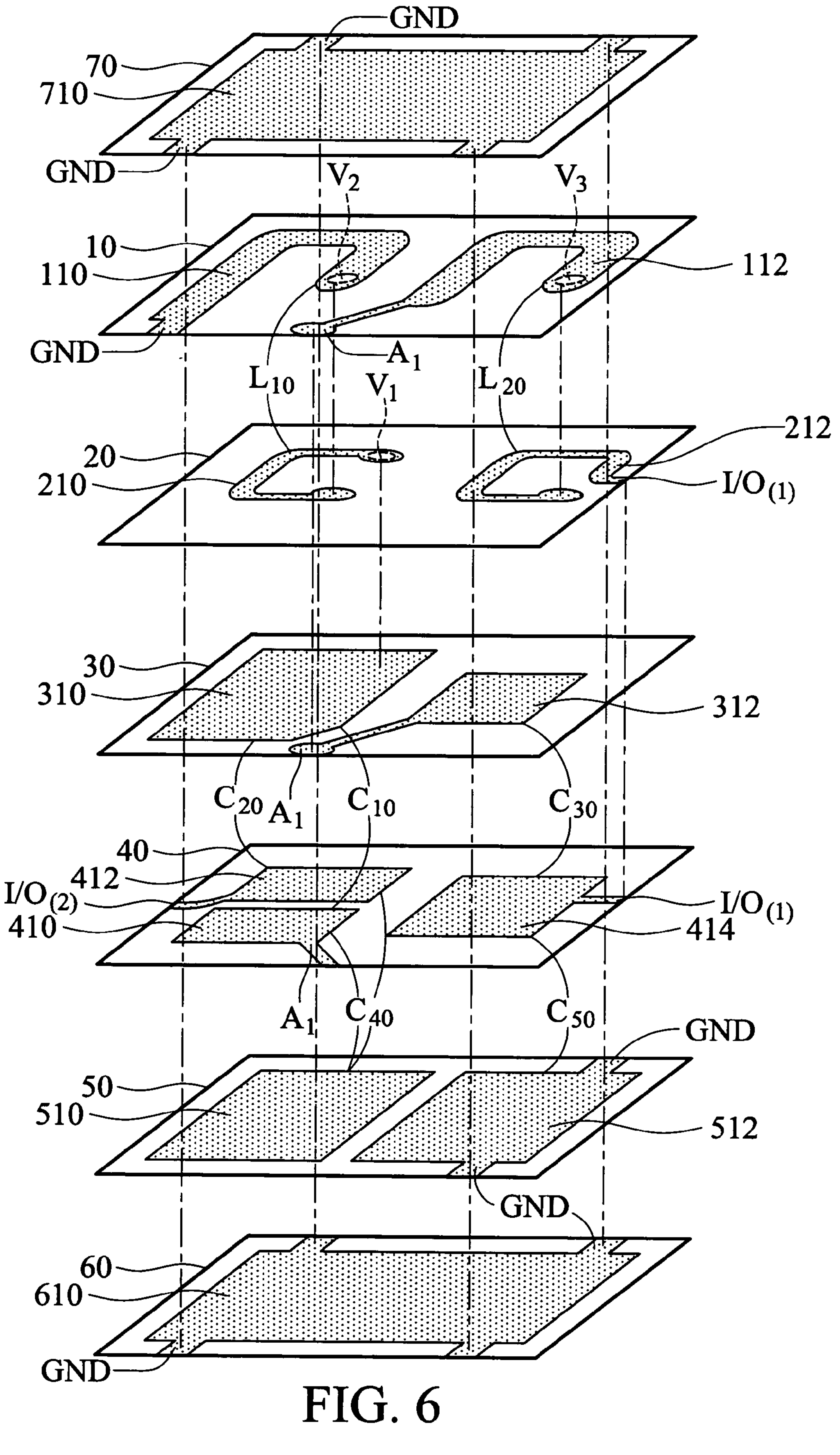
FIG. 6 shows layer configuration of a multilayer diplexer fabricated using multilayer LTCC according to a second embodiment of the invention.

FIG. 6 shows layer configuration of a multilayer diplexer fabricated using multilayer LTCC according to a second embodiment of the invention. The multilayer diplexer in FIG. 6 has circuit configuration corresponding to that in FIG. 5.

In FIG. 6, the multilayer diplexer comprises a first I/O terminal $I/O_{(1)}$, a second I/O terminal $I/O_{(2)}$, at least one reference ground terminal GND, an antenna terminal $A_1$ coupling to an antenna, a first layer 10, a second layer 20, a third layer 30, a fourth layer 40, and a fifth layer 50.

The first layer 10 comprises a first conductor path 110 and a second conductor path 112. One end of the first conductor path 110 is connected to the reference ground GND, and one end of the second conductor path 112 is connected to the antenna terminal $A_1$.

The second layer 20, provided under the first layer 10, comprises a third conductor path 210 and a fourth conductor path 212. One end of the third conductor 210 is connected to the other end of the first conductor path 110 through the first layer 10, whereby the first and third conductor paths 110 and 210 form spiral conductor configuration which functions as a first inductor $L_{10}$. One end of the fourth conductor 212 is connected to the other end of the second conductor path 112 through the first layer 10, whereby the second and fourth conductor paths 112 and 212 form spiral conductor configuration which functions as a second inductor $L_{20}$. The other end of the fourth conductor path 212 is connected to the first I/O terminal $I/O_{(1)}$. The second layer 20 further comprises a first via hole $V_1$ provided therein, and the first layer 10 further comprises a second via hole $V_2$ and a third via hole $V_3$ provided therein. Through the second via hole $V_2$, one end of the third conductor 210 is connected to the other end of the first conductor path 110. Through the third via hole $V_3$, one end of the fourth conductor 212 is connected to the other end of the second conductor path 112.

The third layer 30, provided under the second layer 20, comprises a first conductor plane 310 and a second conductor plane 312 both mutually and electrically isolated, on the third layer 30. The first conductor plane 310 is connected to the other end of the third conductor path 210 through the second layer 20 by passing the first via hole $V_1$. The second conductor plane 312 is connected to the antenna terminal $A_1$.

The fourth layer 40, provided under the third layer 30, comprises a third conductor plane 410, a fourth conductor plane 412 and a fifth conductor plane 414 all mutually and electrically isolated, on the fourth layer 40. The third conductor plane 410 and the first conductor plane 310 constitute a first capacitor $C_{10}$, the fourth conductor plane 412 and the first conductor plane 310 constitute a first capacitor $C_{20}$, the fifth conductor plane 414 and the second conductor plane 312 constitute a third capacitor $C_{30}$. The third conductor plane 410 is further connected to the antenna terminal $A_1$, the fourth conductor plane 412 is further connected to the second I/O terminal $I/O_{(2)}$, and the fifth conductor plane 414 is further connected to the first I/O terminal $I/O_{(1)}$.

The fifth layer 50, provided under the fourth layer 40, comprises a sixth conductor plane 510 and a seventh conductor plane 512 both mutually and electrically isolated, on the fifth layer 50. The sixth conductor plane 510, the third conductor planes 410 and the fourth conductor planes 412 constitute a fourth capacitor $C_{40}$. The seventh conductor plane 512 and the fifth conductor plane 414 constitute a fifth capacitor $C_{50}$. The seventh conductor plane 512 is further connected to the reference ground GND.

The multilayer diplexer of FIG. 6 is manufactured by multilayer LTCC fabrication process, which has circuit configuration corresponding to that in FIG. 5. In the diplexer of FIG. 6, the second inductor $L_{20}$, the third capacitor $C_{30}$, and the fifth capacitor $C_{50}$ constitute low-pass filter 11 of FIG. 5 filtering out (or isolating) signals of high frequency band and passing signals of low frequency band. In the diplexer of FIG. 6, the first capacitor $C_{10}$, the second capacitor $C_{20}$, the fourth capacitor $C_{40}$ and the first inductor $L_{10}$ constitute high-pass filter 30 of FIG. 5 for filtering out (or isolating) signals of low frequency band and passing signals of high frequency band. The circuit configuration of the high-pass filter 3 utilizes Δ-Y transforming theory to reduce required capacitances (respective C of $C_{10}$, $C_{20}$ and $C_{40}$) and inductance (L of $L_{10}$), thereby obtaining required circuit filter function using capacitors and inductors with smaller size. In addition, when the diplexer is fabricated by multilayer LTCC, the bulk of the diplexer can be further scaled down and the cost is reduced.

Referring to FIG. 6, the multilayer diplexer further comprises a sixth layer 60 and a seventh layer 70. The sixth layer 60, provided under the fifth layer 50, comprises a first reference conductor plane 610 connected to the reference ground GND. The seventh layer 70, provided above the first layer 10, comprises a second reference conductor plane 710 connected to the reference ground GND. The first and second reference conductor planes 610 and 710 can provide shielding to the multilayer diplexer isolating outside noises from other devices.

Figure 1:
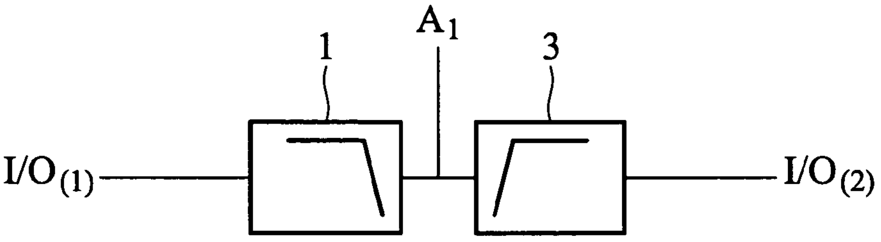
FIG. 1 (RELATED ART)
FIG. 1 schematically shows function blocks of a conventional diplexer.
Figure 2:
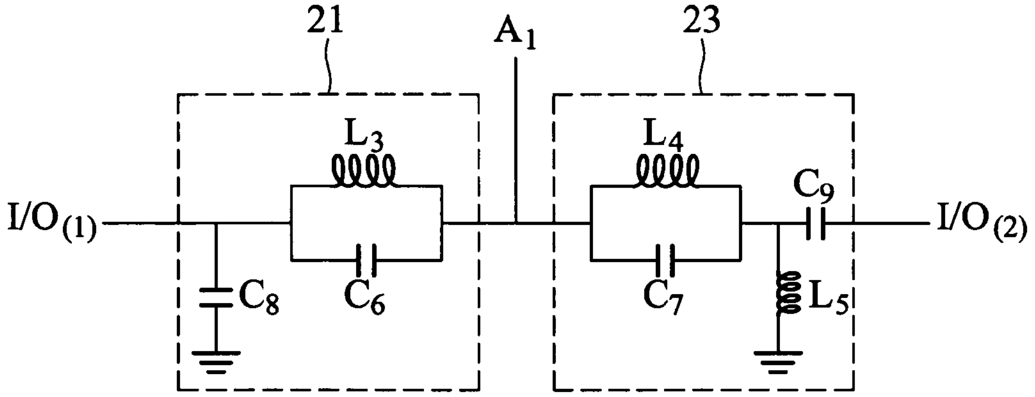
FIG. 2 (RELATED ART)
FIG. 2 is a circuit diagram of a conventional diplexer.
Figure 3:
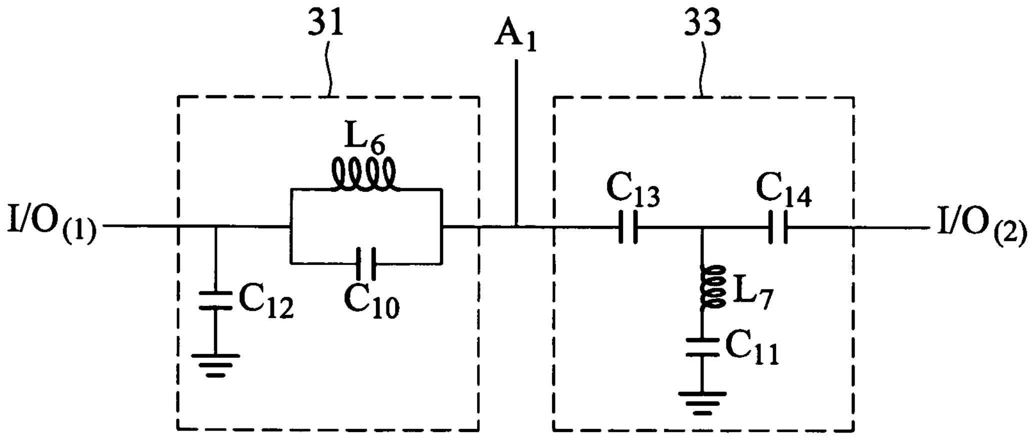
FIG. 3 (RELATED ART)
FIG. 3 is a circuit diagram of another conventional diplexer.
Figure 7:
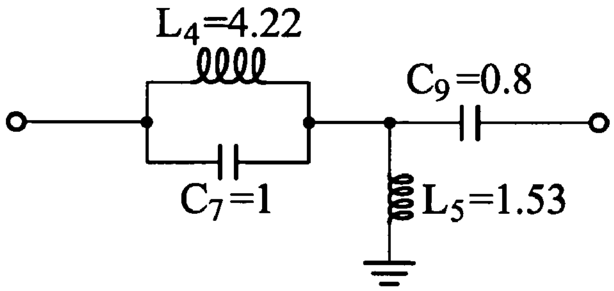
FIG. 7 shows a high-pass filter of FIG. 2 with determined capacitances and inductances.
Figure 8:
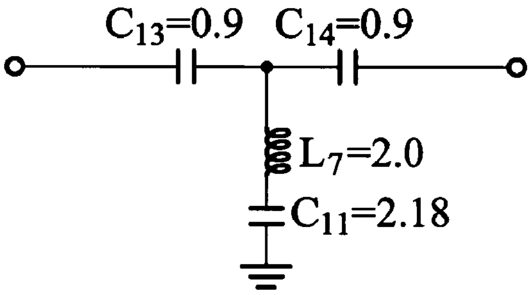
FIG. 8 shows a low-pass filter of FIG. 3 with determined capacitances and inductances.
Figure 9:
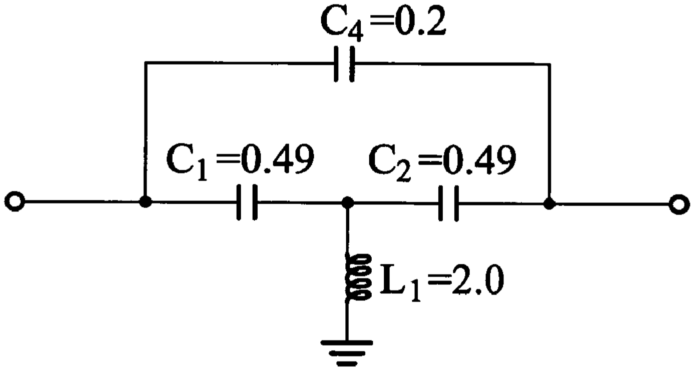
FIG. 9 shows a high-pass filter of FIG. 5 with determined capacitances and inductances.

FIG. 7 and FIG. 8 respectively show high-pass filters of FIG. 2 and FIG. 3 with determined capacitances and inductances. FIG. 9 shows high-pass filters of FIG. 5 with determined capacitances and inductances. The high-pass filters shown in FIGS. 7 to 9 all meet the same filtering requirement and function. The fourth inductor $L_4$ of FIG. 7, the seventh inductor $L_7$ of FIG. 8 and the first inductor $L_{10}$ of FIG. 9 have mutual correspondence for filtering. The inductance of the fourth inductor $L_4$ (equals 4.22) of FIG. 7 is more than twice that of the first inductor $L_{10}$ (equals 2.0) of FIG. 9. In addition, while the inductance of the seventh inductor $L_7$ equals that of the first inductor $L_{10}$, the capacitances of the capacitors $C_{11}$ (=2.18), $C_{13}$ (=0.9) and $C_{14}$ (=0.9) of FIG. 8 are larger than the capacitances of the capacitors $C_{10}$ (=0.49), $C_{20}$ (=0.49) and $C_{40}$ (=0.2) of FIG. 9.

From the above descriptions, the high-pass filter of FIG. 9 uses Δ-Y transforming theory and therefore can be implemented using devices with smaller inductances and capacitances while achieving required functions. Consequently, the diplexer with the high-pass filter of FIG. 9 becomes more simplified in wire routing or layout design. When the diplexer with the high-pass filter of FIG. 9 is fabricated by multilayer LTCC, the bulk of the diplexer can be further reduced, more economical in fabrication.

While the invention has been described by way of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multilayer diplexer comprising:

a first I/O terminal;

a second I/O terminal;

at least one reference ground;

an antenna terminal for coupling an antenna;

a first layer having a first conductor path with one end connected to the reference ground, and a second conductor path with one end connected to the antenna terminal;

a second layer, provided under the first layer, having a third conductor path and a fourth conductor path; wherein one end of the third conductor path connected to the other end of the first conductor path through the first layer such that the first and third conductor paths form spiral conductor configuration which functions as a first inductor, and one end of the fourth conductor path connected to the other end of the second conductor path through the first layer such that the second and fourth conductor paths form spiral conductor configuration which functions as a second inductor, and the other end of the fourth conductor path is connected to the first I/O terminal;

a third layer, provided under the second layer, having a first conductor plane connected to the other end of the third conductor path through the second layer, and a second conductor plane connected to the antenna terminal;

a fourth layer, provided under the third layer, having a third conductor plane, a fourth conductor plane and a fifth conductor plane; wherein the first and third conductor planes constitute a first capacitor, the first and fourth conductor planes constitute a second capacitor, and the second and fifth conductor planes constitute a third capacitor; and the third conductor plane is connected to the antenna terminal, the fourth conductor plane is connected to the second I/O terminal, and the fifth conductor plane is connected to the first I/O terminal; and a fifth layer, provided under the fourth layer, having a sixth conductor plane and a seventh conductor plane; wherein the sixth conductor plane, the third and fourth conductor planes constitute a fourth capacitor; the seventh conductor plane and the fifth conductor plane constitute a fifth capacitor; and the seventh conductor plane is connected to the reference ground.

2. The diplexer as claimed in claim 1, further comprising a sixth layer provided under the fifth layer, having a first reference conductor connected to the reference ground.

3. The diplexer as claimed in claim 1, further comprising a seventh layer provided above the first layer, having a second reference conductor connected to the reference ground.

4. The diplexer as claimed in claim 1, further comprising a sixth layer provided under the fifth layer, having a first reference conductor connected to the reference ground; and a seventh layer provided above the first layer, having a second reference conductor connected to the reference ground.

5. The diplexer as claimed in claim 1, wherein the first layer further has a via hole through which one end of the third conductor path is connected to the other end of the first conductor path.

6. The diplexer as claimed in claim 1, wherein the first layer further has a via hole through which one end of the fourth conductor path is connected to the other end of the second conductor path.

7. The diplexer as claimed in claim 1, wherein the first and second conductor planes are electrically and mutually isolated on the third layer.

8. The diplexer as claimed in claim 1, wherein the third, fourth and fifth conductor planes are electrically and mutually isolated on the third layer.

9. The diplexer as claimed in claim 1, wherein the sixth and seventh conductor planes are electrically and mutually isolated on the third layer.

10. The diplexer as claimed in claim 1, wherein the first, second and fourth capacitors and the first inductor constitute a high-pass filter.

11. The diplexer as claimed in claim 1, wherein the third and fifth capacitors and the second inductor constitute a low-pass filter.

* * * * *